(12) United States Patent
Jeong

(10) Patent No.: US 9,275,984 B2
(45) Date of Patent: Mar. 1, 2016

(54) MULTI-CHIP PACKAGE SYSTEM

(71) Applicant: SK hynix Inc., Gyeonggi-do (KR)

(72) Inventor: Chun-Seok Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 53 days.

(21) Appl. No.: 13/935,966

(22) Filed: Jul. 5, 2013

(65) Prior Publication Data

US 2014/0306753 A1    Oct. 16, 2014

(30) Foreign Application Priority Data

Apr. 11, 2013  (KR) .................. 10-2013-0040066

(51) Int. Cl.
*H01L 25/00*  (2006.01)
*H01L 27/02*  (2006.01)
*G11C 5/06*  (2006.01)
*G11C 29/02* (2006.01)
*G11C 7/20*  (2006.01)
*G11C 8/12*  (2006.01)

(52) U.S. Cl.
CPC ............ *H01L 27/0203* (2013.01); *G11C 5/063* (2013.01); *G11C 29/025* (2013.01); *G11C 29/028* (2013.01); *G11C 7/20* (2013.01); *G11C 8/12* (2013.01); *G11C 2207/105* (2013.01)

(58) Field of Classification Search
CPC .................. H03K 19/003; H03K 19/0005
USPC ................. 327/565; 365/63; 326/226
See application file for complete search history.

(56) References Cited

U.S. PATENT DOCUMENTS

| 7,788,468 | B1* | 8/2010 | Nickolls et al. ................. 712/22 |
| 2010/0027309 | A1* | 2/2010 | Park ................................ 365/63 |
| 2013/0002291 | A1* | 1/2013 | Park ................................ 326/30 |

FOREIGN PATENT DOCUMENTS

| KR | 1020110112707 | 10/2011 |
| KR | 1020110129149 | 12/2011 |
| KR | 1020110138099 | 12/2011 |
| KR | 1020120045330 | 5/2012 |

* cited by examiner

*Primary Examiner* — Sibin Chen
*Assistant Examiner* — Metasebia Retebo
(74) *Attorney, Agent, or Firm* — IP & T Group LLP

(57) ABSTRACT

A multi-chip package system includes a signal transmission line commonly coupled to a plurality of semiconductor chips to transfer data to/from the semiconductor chips from/to outside; and a termination controller suitable for detecting a loading value of the signal transmission line and controlling a termination operation on the signal transmission line based on the loading value.

4 Claims, 4 Drawing Sheets

MULTI-CHIP PACKAGE SYSTEM

CROSS-REFERENCE TO RELATED APPLICATIONS

The present application claims priority of Korean Patent Application No. 10-2013-0040066, filed on Apr. 11, 2013, which is incorporated herein by reference in its entirety.

BACKGROUND

1. Field

Exemplary embodiments of the present invention relate to a semiconductor design technology, and more particularly, to a multi-chip package system including a plurality of semiconductor chips.

2. Description of the Related Art

In general, semiconductor devices including Double Data Rate Synchronous DRAM (DDR SDRAM) have developed in various directions to satisfy users' requests. The development directions may include a package technology. A multi-chip package has been recently proposed as a package technology for a semiconductor device. The multi-chip package includes a plurality of semiconductor chips constructing a single chip, and a plurality of memory chips with a memory function may be used to increase a memory capacity, or a plurality of memory chips with different functions may be used to improve desired performance. For reference, the multi-chip package may be divided into a single-layer multi-chip package and a multilayer multi-chip package depending on configurations. The single-layer multi-chip package includes a plurality of semiconductor chips arranged in parallel to each other on the same plane, for example, coplanar, and the multi-chip package includes a plurality of semiconductor chips stacked therein.

FIG. 1 is a block diagram for explaining a conventional chip package.

Referring to FIG. 1, the multi-chip package includes a plurality of semiconductor chips 110 and a controller 120 to control the semiconductor chips 110. The plurality of semiconductor chips 110 and the controller 120 are connected to each other through a signal transmission line LL, and the controller 120 transmits a predetermined signal through the signal transmission line LL so as to control the plurality of semiconductor chips 110.

Meanwhile, recent semiconductor devices have been developed in such a direction as to store a larger amount of data and perform various operations at higher speed. Therefore, the number of semiconductor chips 110 constructing a multi-chip package as described above has been gradually increased. When the number of semiconductor chips 110 is increased, it may mean that loading of the signal transmission line LL connected to the controller 120 is increased as much. Furthermore, when the loading of the signal transmission line LL is increased, it may mean that a delay amount corresponding to the increased loading is additionally reflected into a signal transmitted through the signal transmission line LL. When the delay amount is significantly increased, the signal may not be transmitted at high speed.

SUMMARY

Various exemplary embodiments are directed to a multi-chip package system capable of controlling a signal transmission state depending on the state of a transmission line commonly connected to a plurality of semiconductor chips.

In accordance with an embodiment of the present invention, a multi-chip package system includes a signal transmission line commonly coupled to a plurality of semiconductor chips to transfer data to/from the semiconductor chips from/to outside; and a termination controller suitable for detecting a loading value of the signal transmission line and controlling a termination operation on the signal transmission line based on the loading value.

In accordance with another embodiment of the present invention, a multi-chip package system includes a controller suitable for generating an enable signal for controlling an enable operation for a plurality of semiconductor chips, a switching block suitable for coupling a signal transmission line to a number of semiconductor chips wherein the number of semiconductor chips to be coupled is determined in response to the enable signal, and a termination controller suitable for controlling a termination operation on the signal transmission line in response to the enable signal.

In accordance with yet another embodiment of the present invention, a multi-chip package includes a plurality of semiconductor chips coupled to a through-silicon via (TSV) for transmitting a predetermined signal. Each of the semiconductor chips includes a chip identification (ID) generator suitable for generating a chip ID of a corresponding semiconductor chip, and a termination controller suitable for controlling a termination operation on the TSV in response to an output signal of the chip ID generator.

In accordance with still yet another embodiment of the present invention, a multi-chip package system includes a multi-chip package including a plurality of semiconductor chips coupled to a TSV for transmitting a predetermined signal, and a controller suitable for controlling a termination operation on the TSV in response to the number of the plurality of semiconductor chips.

DETAILED DESCRIPTION

Figure 1:
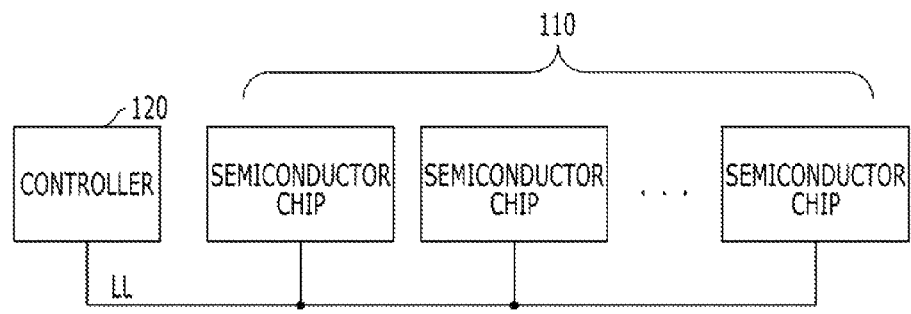
FIG. 1 is a block diagram for explaining a conventional multi-chip package.

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

Figure 2:
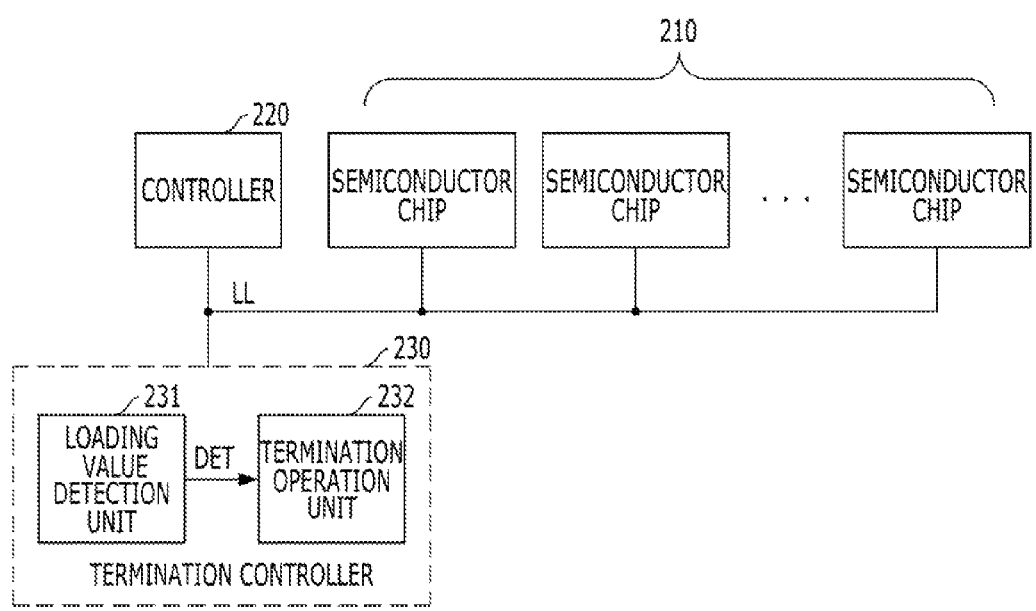
FIG. 2 is a block diagram for explaining a multi-chip package system in accordance with an exemplary embodiment of the present invention.

FIG. 2 is a block diagram for explaining a multi-chip package system in accordance with an exemplary embodiment of the present invention.

Referring to FIG. 2, the multi-chip package system includes a plurality of semiconductor chips 210, a controller 220, and a termination controller 230.

The plurality of semiconductor chips 210 are controlled by the controller 220, and the plurality of semiconductor chips 210 and the controller 220 are commonly connected to a signal transmission line LL. The controller 220 is configured to transmit a predetermined signal through the signal transmission line LL so as to control the plurality of semiconductor chips 210.

The termination controller 230 is configured to detect a loading value of the signal transmission line LL to control a termination operation for the signal transmission line LL. The termination controller 230 includes a loading value detection unit 231 and a termination operation unit 232. The loading value detection unit 231 is configured to detect a loading value of the signal transmission line LL and output the detected value as a detection signal DET, and the termination operation unit 232 is configured to perform a termination operation on the signal transmission line LL in response to the detection signal DET.

In this exemplary embodiment of the present invention, a swing width of a signal transmitted through the signal transmission line LL may be controlled through the termination operation. That is, since the signal transmitted through the signal transmission line LL on which the termination operation has been performed has a small swing width, the system may perform a high-speed operation. However, when the termination operation is performed, the signal transmission line LL is driven to a predetermined voltage level, and thus power consumption inevitably increases. In this exemplary embodiment of the present invention, whether or not to perform a termination operation may be controlled depending on the loading value of the signal transmission line LL, which makes it possible to realize high-speed operation and low power consumption. In other words, when the loading value of the signal transmission line LL is relatively small, a termination operation may not be performed to reduce power consumption. When the loading value of the signal transmission line LL is relatively large, a termination operation may be performed for a high-speed operation.

Figure 3:
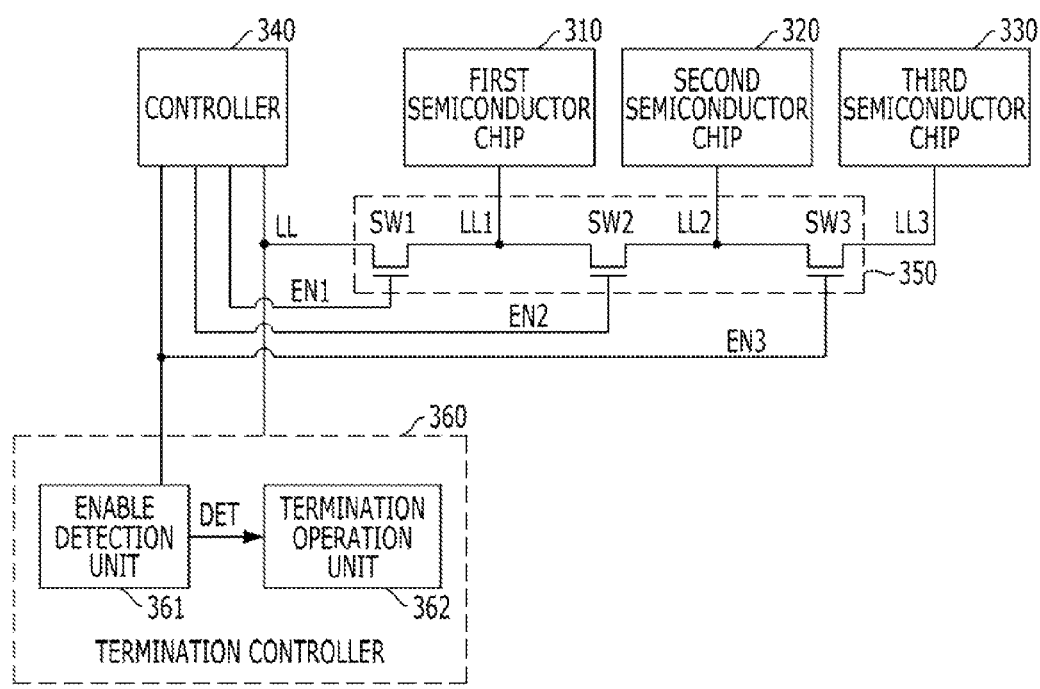
FIG. 3 is a block diagram for explaining a multi-chip package system in accordance with another exemplary embodiment of the present invention.

FIG. 3 is a block diagram for explaining a multi-chip package system in accordance with another exemplary embodiment of the present invention.

Referring to FIG. 3, the multi-chip package system includes a plurality of semiconductor chips 310, 320, and 330, a controller 340, a switching block 350, and a termination controller 360.

The plurality of semiconductor chips 310, 320, and 330 are controlled by the controller 340 as in FIG. 2. For the illustrative purpose, three semiconductor chips, that is, first to third semiconductor chips 310, 320, and 330 will be taken as an example.

The controller 340 is configured to generate first to third enable signals EN1, EN2, and EN3 for controlling an enable operation for the first to third semiconductor chips 310, 320, and 330, respectively. The first enable signal EN1 is a signal for enabling the first semiconductor chip 310. Although not illustrated, the first enable signal EN1 may be applied to the first semiconductor chip 310 so as to control the enable operation. The second and third enable signal's EN2 and EN3 are signals for enabling the second and third semiconductor chips 320 and 330, respectively. Similarly, the second and third enable signals EN2 and EN3 may be applied to the second and third semiconductor chips 320 and 330 so as to control the enable operation.

The switching block 350 is configured to connect signal transmission lines, corresponding to semiconductor chips which are enabled in response to the first to third enable signals EN1, EN2, and EN3, to one transmission line and includes first to third switching units SW1, SW2, and SW3. The first switching unit SW1 is configured to connect a first signal transmission line LL1 corresponding to the first semiconductor chip 310 to a signal transmission line LL in response to the first enable signal EN1, the second switching unit SW2 is configured to connect a second signal transmission line LL2 corresponding to the second semiconductor chip 320 to the first signal transmission line LL1 in response to the second enable signal EN2, and the third switching unit SW3 is configured to connect a third signal transmission line LL3 corresponding to the third semiconductor chip 330 to the second signal transmission line LL2 in response to the third enable signal EN3. For example, when the first and second enable signals EN1 and EN2 are activated, the controller 340 and the first and second semiconductor chips 310 and 320 are connected through the signal transmission lines LL, LL1, and LL2 that are formed to one transmission line.

The termination controller 360 serves to control a termination operation of the signal transmission line LL in response to the third enable signal EN3, and includes an enable detection unit 361 and a termination operation unit 362. The enable detection unit 361 serves to detect that the third enable signal EN3 is activated and output a detection signal DET, and the termination operation unit 362 serves to perform a termination operation on the signal transmission line LL in response to the detection signal DET.

The multi-chip package system of FIG. 3 may perform a termination operation, when the third enable signal EN is activated, that is, when the first to third enable signals EN1 to EN3 are activated to connect the controller 340 and the first to third semiconductor chips 310 to 330 through the signal transmission lines LL, LL1, LL2, and LL3 that are formed to one transmission line. Therefore the enable detection unit 361 receives the third enable signal EN3 and detects whether the third enable signal EN3 is activated or not.

Hereafter, a simple circuit operation will be described.

First when only the first enable signal EN1 is activated, the controller 340 and the first semiconductor chip 310 are connected through the signal transmission lines LL and LL1 that are formed to one transmission line. In the configuration of FIG. 3 that controls whether or not to perform a termination operation in response to the third enable signal EN3, suppose that one transmission line made from the signal transmission lines LL and LL1 connected in response to the first enable signal EN1 has a relatively small loading value, for example, a value less than a given value. A termination operation is not therefore performed on the signal transmission line LL or LL1 connected through the first enable signal EN1. As a result, while a signal is transmitted, power consumption by a termination operation does not occur.

Next, when the first to third enable signals EN1 to EN3 are activated, the controller 340 and the first to third semiconductor chips 310 to 330 are connected through one signal transmission line LL, LL1, LL2, and LL3. In the configuration of FIG. 3, suppose that one transmission line made from the signal transmission line LL, LL1, LL2, and LL3 connected in response to the first to third enable signals EN1 to EN3 has a relatively large loading value, for example, a value equal to or more than a given value. Therefore, a termination operation is performed on one transmission line made from the signal transmission line LL, LL1, LL2, and LL3 connected in response to the first to third enable signals EN1 to EN3. As a result, a signal is transmitted with a small swing by the termination operation.

The multi-chip package in accordance with the embodiment of the present invention may detect a loading value of one signal transmission line through which enabled semiconductor devices are connected to each other, and may control whether or not to perform a termination operation according to the detection result.

Figure 4:
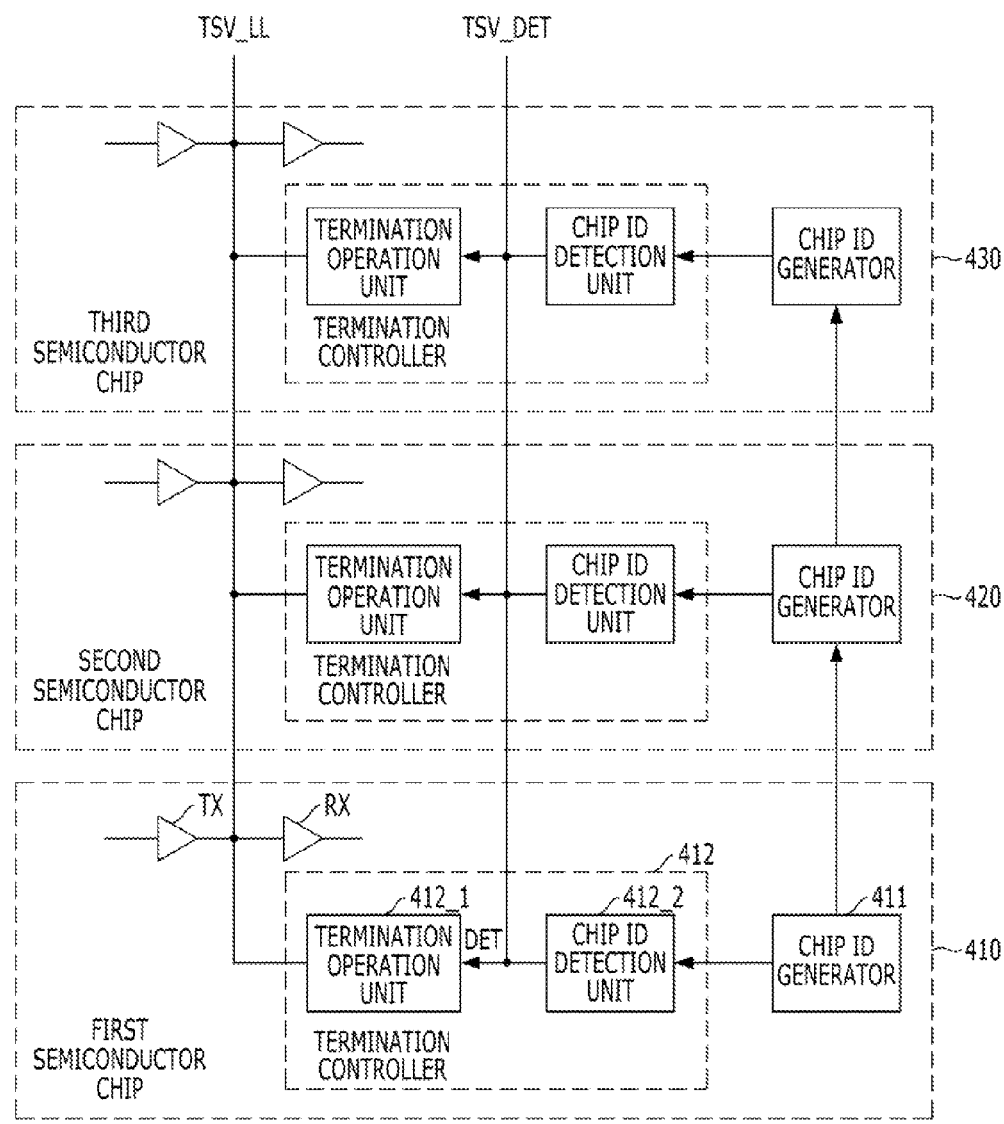
FIG. 4 is a block diagram for explaining a multi-chip package system in accordance with another exemplary embodiment of the present invention.

FIG. 4 is a block diagram for explaining a multi-chip package system in accordance with another exemplary embodiment of the present invention. FIG. 4 illustrates a case in which three semiconductor chips 410, 420, and 430 are provided.

Referring to FIG. 4, the multi-chip package system includes first to third semiconductor chips 410 to 430, and the first to third semiconductor chips 410 to 430 are connected to a first through-silicon via (TSV) TS_LL for transmitting a predetermined signal, and a second TSV TSV_DET for transmitting a detection signal DET. For convenience of description, the first semiconductor chip 410 will be taken as a representative example.

The first semiconductor chip 410 includes a transmitter TX and a receiver RX which are connected to the first TSV TSV_LL. Furthermore, the first semiconductor chip 410 includes a chip identification (ID) generator 411 and a termination controller 412.

The transmitter TX is configured to receive a signal transmitted to the first semiconductor chip 410 and transmit the received signal to the first TSV TSV_LL, and the receiver RX is configured to receive a signal transmitted through the first TSV TSV_LL and transmit the received signal to internal circuits.

The chip ID generator 411 serves to allocate a chip ID to the first semiconductor chip 410. In the configuration of FIG. 4 in which the first semiconductor chip 410 is disposed at the lowermost part and the third semiconductor chip 430 is disposed at the uppermost part, the chip ID generator 411 of the first semiconductor chip 410 allocates a chip ID corresponding to '1' to the first semiconductor chip 410, the chip ID generator of the second semiconductor chip 420 receives the chip ID corresponding to '1' and allocates a chip ID corresponding to '2' to the second semiconductor chip 420, and the chip ID generator of the third semiconductor chip 430 receives the chip ID corresponding to '2' and allocates a chip ID corresponding to '3' to the third semiconductor chip 430.

The termination controller 412 is configured to control a termination operation for the first TSV TSV_LL in response to an output signal of the chip ID generator 411, and includes a chip ID detection unit 412_1 and a termination operation unit 412_2. The chip ID detection unit 412_1 is configured to compare the chip ID corresponding to '1' to a given chip ID and generate a detection signal DET, and the termination operation unit 412_2 is configured to perform a termination operation on the first TSV TSV_LL in response to the detection signal DET. At this time, the detection signal DET may be transmitted to all of the first to third semiconductor chips 410 to 430 through the second TSV TSV_DET.

The multi-chip package in accordance with the embodiment of the present invention may compare a chip ID of a corresponding semiconductor chip to a given chip ID, and control whether or not to perform a termination operation according to the comparison result. The given chip ID may include information indicating that a termination operation will be performed when the number of stacked semiconductor chips becomes equal to or more than a predetermined number. Supposing that the given chip ID corresponds to '3', a termination operation is performed on the first TSV TSV_LL when the number of stacked semiconductor chips is equal to or more than three, and is not performed on the first TSV TSV_LL when the number of stacked semiconductor chips is less than three.

In the embodiment of FIG. 4, the given chip ID may be stored in the chip ID detection unit of each of the first to third semiconductor chips. That is, whether or not to perform a termination operation is determined inside the multi-chip package. In an embodiment of FIG. 5 which will be described below, whether or not to perform a termination operation may be determined outside the multi-chip package, FIG. 5 is a block diagram for explaining a multi-chip package system in accordance with another exemplary embodiment of the present invention.

Figure 5:
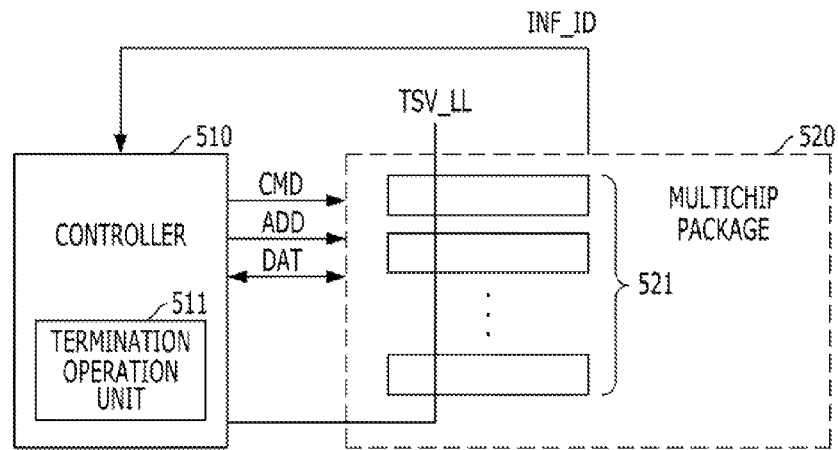
FIG. 5 is a block diagram for explaining a multi-chip package system in accordance with another exemplary embodiment of the present invention.

Referring to FIG. 5 the multi-chip package system includes a controller 510 and a multi-chip package 520.

The controller 510 controls the multi-chip package 520 using a command CMD, an address ADD, data DATA and the like, and controls a termination operation for the multi-chip package 520 in response to ID information INF_ID which will be described below. The multi-chip package 520 includes a plurality of semiconductor chips 521 controlled by the controller 510, and the plurality of semiconductor chips 521 are connected to a TSV TSV_LL for transmitting a predetermined signal to the plurality of semiconductor chips 521.

Meanwhile, the controller 510 controls a termination operation for the first TSV TSV_LL in response to the ID information INF_ID. At this time, the ID information INF_ID may include a chip ID described with reference to FIG. 4. That is, each of the semiconductor chips 521 provided in the multi-chip package 520 counts a chip ID and allocates the counted chip ID as a chip ID for identifying the corresponding semiconductor chip, and the ID information IF_ID may include a finally-counted chip ID. Then, the controller 510 compares the counted chip ID to a given chip ID, and determines whether or not to perform a termination operation for the first TSV TSV_LL depending on the comparison result.

Figure 6:
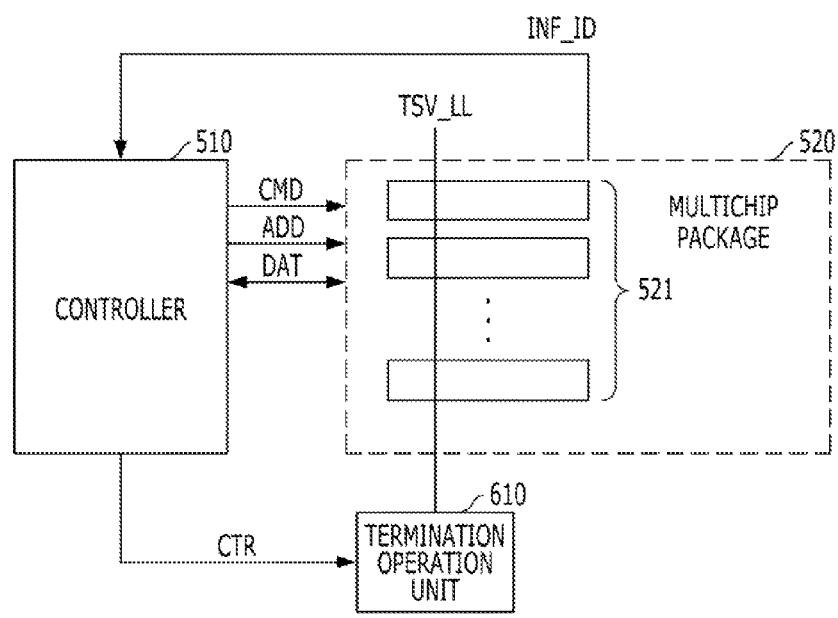
FIG. 6 is a block diagram for explaining a multi-chip package system in accordance with another exemplary embodiment of the present invention.

FIG. 6 is a block diagram for explaining a multi-chip package system in accordance with another exemplary embodiment of the present invention. The multi-chip package system of FIG. 6 is different from the multi-chip package system of FIG. 5 only in that the position of the termination operation unit 610 is different. That is, the termination operation unit 610 of FIG. 6 is disposed outside the controller 510, and disposed more adjacent to the multi-chip package 520 than the controller 510.

Referring to FIG. 6, the controller 510 generates a control signal CTR for controlling a termination operation in response to ID information INF_ID generated by the multi-chip package 520, and the termination operation unit 610 performs a termination operation on a TSV TSV_LL connected to the multi-chip package 520 in response to the control signal CTR.

As seen from FIGS. 5 and 6, the multi-chip package system in accordance with the exemplary embodiment of the present invention may detect ID information counted in the multi-chip package and control whether or not to perform a termination operation depending on the detection result.

As described above, the multi-chip package systems in accordance with the embodiments of the present invention may determine whether or not to perform a termination operation depending on a loading value of a signal transmission line. In another embodiment, the multi-chip package system may also determine whether or not to perform a termination operation according to an enable signal for connecting a signal transmission line. In another embodiment, the multi-chip package system may also determine whether or not to perform a termination operation depending on chip ID information of a plurality of semiconductor chips connected through a TSV. As a result, the multi-chip package system in accordance with the embodiment of the present invention may efficiently control whether or not to perform a termination operation, thereby acquiring a gain in terms of operation speed or power consumption when a signal is transmitted.

In accordance with the embodiments of the present invention, since the multi-chip package system may control a termination operation depending on a loading value of a signal transmission line, the multi-chip package system may operate more efficiently in terms of operation speed or power consumption.

Although various embodiments have been described for illustrative purposes, it will be apparent to those skilled in the art that various changes and modifications may be made without departing from the spirit and scope of the invention as defined in the following claims.

What is claimed is:

1. A multi-chip package comprising a plurality of semiconductor chips coupled to a through-silicon via (TSV) for transmitting a predetermined signal,
wherein each of the semiconductor chips comprises:
   a chip identification (ID) generator suitable for generating a chip ID of a corresponding semiconductor chip; and
   a termination controller suitable for controlling a termination operation on the TSV in response to an output signal of the chip ID generator.

2. The multi-chip package of claim 1, wherein the termination controller performs the termination operation on the TSV according to a given chip ID.

3. The multi-chip package of claim 1, wherein the termination controller comprises:
   a chip ID detection unit suitable for comparing the chip ID generated by the chip ID generator with a given chip ID and outputting the detection result as a detection signal; and
   an operation unit suitable for performing the termination operation on the TSV in response to the detection signal.

4. The multi-chip package of claim 3, further comprising:
   a TSV suitable for transmitting the detection signal to each of the semiconductor chips.

* * * * *